(12) United States Patent
Hsu

(10) Patent No.: US 6,882,057 B2  
(45) Date of Patent: Apr. 19, 2005

(54) QUAD FLAT NO-LEAD CHIP CARRIER

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/605,275

(22) Filed: Sep. 19, 2003

(65) Prior Publication Data

US 2004/0262724 A1 Dec. 30, 2004

(30) Foreign Application Priority Data

Jun. 25, 2003 (TW) ........................................ 92117230 A

(51) Int. Cl.⁷ .......................... H01L 23/48; H01L 23/52; H01L 29/40
(52) U.S. Cl. ........................ 257/784; 257/774; 257/787; 257/676; 257/666; 257/712; 257/713
(58) Field of Search ................................ 257/784, 774, 257/787, 676, 712, 713, 708

(56) References Cited

U.S. PATENT DOCUMENTS 5,122,860 A * 6/1992 Kikuchi et al. ............. 257/679
6,400,010 B1 * 6/2002 Murata ........................ 257/706
2003/0151139 A1 * 8/2003 Kimura ....................... 257/737

* cited by examiner

Primary Examiner—Nitin Parekh
(74) Attorney, Agent, or Firm—Jiang Chyun IP Office

(57) ABSTRACT

A quad flat no-lead chip carrier for a wire-bonded chip package is provided. The chip carrier comprises a conductive plate, a plurality of conductive columns and a plurality of dielectric walls. A chip is attached to the conductive plate. The conductive plate furthermore has a plurality of columnar through holes distributed around a chip-bonding region. The conductive columns are set up within the columnar through holes. The dielectric walls are set up between the sidewall of the conductive columns and the inner surface of the columnar through holes. The chip is electrically connected to the conductive columns via conductive wires. The bottom end of the conductive columns serves as input/output contacts for connecting with external contacts. The chip carrier is able to increase overall density of the input/output contacts and improve the electrical performance of the chip package.

15 Claims, 3 Drawing Sheets

QUAD FLAT NO-LEAD CHIP CARRIER

CROSS REFERENCE TO RELATED APPLICATIONS

This application claims the priority benefit of Taiwan application serial no. 92117230, filed on Jun. 25, 2003.

BACKGROUND OF INVENTION

1. Field of Invention

The present invention relates to a chip carrier. More particularly, the present invention relates to a quad flat no-lead (QFN) chip carrier and a chip package structure.

2. Description of Related Art

Semiconductor fabrication is a most rapidly developed high-tech industry. Following recent advance in electronic technologies, many types of personalized and multi-functional electronic products with a compact design are out in the market. At present, lead frame is still one of the major components in packaging semiconductor chips. According to the type of leads in the lead frame, a quad flat package (QFP) can be divided into quad flat package with I-type leads (QFI), quad flat package with J-type leads (QFJ) and quad flat package no-lead (QFN). Because the outer end of the leads of the lead frame are uniformly cut along the four edges of a chip package, this type of package is also referred to as a quad flat no-lead chip package. Since a quad flat package has a shorter average transmission trace and a faster signal transmission speed, it is one of the most popular low-pin-count packages for high frequency (for example, radio frequency bandwidth) transmission.

FIG. 1A is a schematic cross-sectional view of a conventional quad flat no-lead package. FIG. 1B is a bottom view of the quad flat no-lead package as shown in FIG. 1A. As shown in FIG. 1A, the quad flat no-lead package 100 comprises a chip 110, a die pad 120, a plurality of conductive wires 130, a plurality of leads 140 and some insulating material 150. The chip 110 has an active surface 112 and a backside 114. The active surface 112 of the chip 110 has a plurality of bonding pads 116 thereon. The backside 114 of the chip 110 is attached to the die pad 120 through silver epoxy 118. In addition, the bonding pads 116 on the chip 110 are electrically connected to corresponding leads 140 through the conductive wires 130. The insulating material 150 encloses the chip 110, the conductive wires 130, the upper surface of the die pad 120 and the upper surface of the leads 140 so that the chip 110 and the conductive wires 130 are protected. Moreover, the chip 110 may connect electrically to the die pad 120 through a ground (or power) wire 132. The purpose of having an electrical connection between the chip 110 and the die pad 120 is that the chip 110 can have a relatively larger ground plane or power plane.

As shown in FIG. 1B, the bottom surface of the die pad 120 and the bottom surface of the leads 140 are exposed outside the insulating material 150. The outer ends of the leads 140 are uniformly cut along the four edges of the package and arranged to surround the peripheral region just outside the die pad 120. The leads 140 on the chip package 100 serve as input/output (I/O) contacts for connecting with external devices.

Note that the pitches of the neighboring leads 140 can hardly be reduced when the number of I/O contacts in the chip package 100 is required to increase. Furthermore, the outer ends of the leads 140 must extend to the edge of the package 150. Therefore, the density of the leads 140 with this type of package arrangment has little potential for growth. In addition, some of the injected insulating material 150 may bleed onto the bottom surface of the die pad 120 or the bottom surface of the leads 140. Since the bled out insulating material 150 is hard to remove, quality of the chip package may be affected. Moreover, it is common to set up a guard wire (not shown) on each side of a signal wire 130 to prevent cross talk between two neighboring signal wires 130. However, this often leads to an increase in area for the die pad 120 and hence a drop in the maximum number and density of leads 140 permitted by a package of a given dimension.

SUMMARY OF INVENTION

Accordingly, one object of the present invention is to provide a quad flat no-lead chip carrier for increasing the density of input/output (I/O) contacts in a chip package.

A second object of this invention is to provide a quad flat no-lead type of chip package capable of reducing insulating material bleeding during a packaging operation so that electrical performance of the chip package is improved.

To achieve these and other advantages and in accordance with the purpose of the invention, as embodied and broadly described herein, the invention provides a quad flat no-lead chip carrier. The quad flat no-lead chip carrier comprises a conductive plate. The conductive plate has a first surface and a second surface. The first surface has a chip-bonding region. The conductive plate furthermore comprises a plurality of columnar through holes located around the periphery of the chip-bonding region and passing through the conductive plate so that the first surface and the second surface are connected. In addition, a plurality of conductive columns is set up within the respective columnar through holes. Furthermore, a plurality of dielectric walls is set up between a sidewall of the conductive columns and an inner surface of the columnar through holes.

This invention also provides a quad flat no-lead chip package. The chip package comprises a chip carrier, a chip, a plurality of first conductive wires and some insulating material. The chip carrier furthermore comprises a conductive plate, a plurality of conductive columns and a plurality of dielectric layers. The conductive plate has a first surface and a second surface. The first surface has a chip-bonding region. The conductive plate furthermore has a plurality of columnar through holes distributed on the periphery of the chip-bonding region and passing through the conductive plate to connect the first surface with the second surface. The conductive columns are set up within various columnar through holes. A plurality of dielectric walls is set up between a sidewall of the conductive columns and an inner surface of the columnar through holes. Furthermore, the chip is attached to the chip-bonding region on the first surface of the conductive plate. The first conductive wires connect the chip and the conductive columns electrically. The insulating material encloses the chip and the conductive wires.

This invention deploys a conductive plate with a plurality of columnar through holes to serve as the carrier of a chip. The chip is electrically connected to the conductive column within each columnar through hole in the conductive plate. Furthermore, the conductive column forms various independent input/output (I/O) contacts through the insulating effect of dielectric walls. Because the distance of separation between two neighboring conductive columns can be reduced, density of I/O contacts within the chip package is increased. In addition, insulating material bleeding into the bottom surface of the chip carrier during a packaging operation is rare so that overall quality of the chip package is improved. Moreover, with the conductive plate serving as a reference plane, the degree of external interference during a signal passing through one of the conductive columns is greatly reduced.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
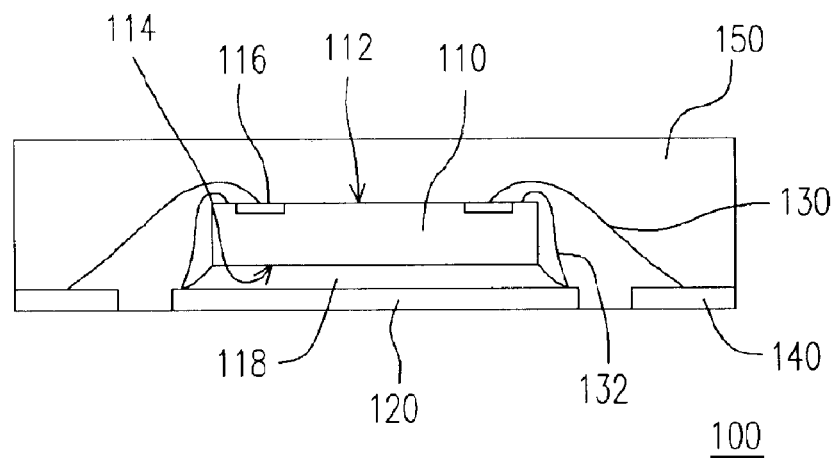
FIG. 1A is a schematic cross-sectional view of a conventional quad flat no-lead package.
Figure 1B:
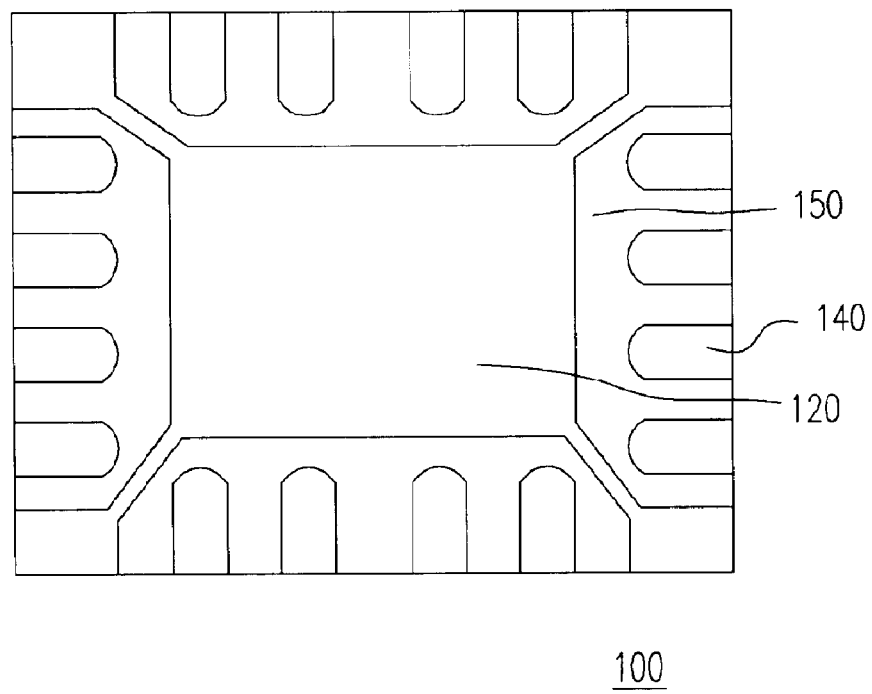
FIG. 1B is a bottom view of the quad flat no-lead package as shown in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
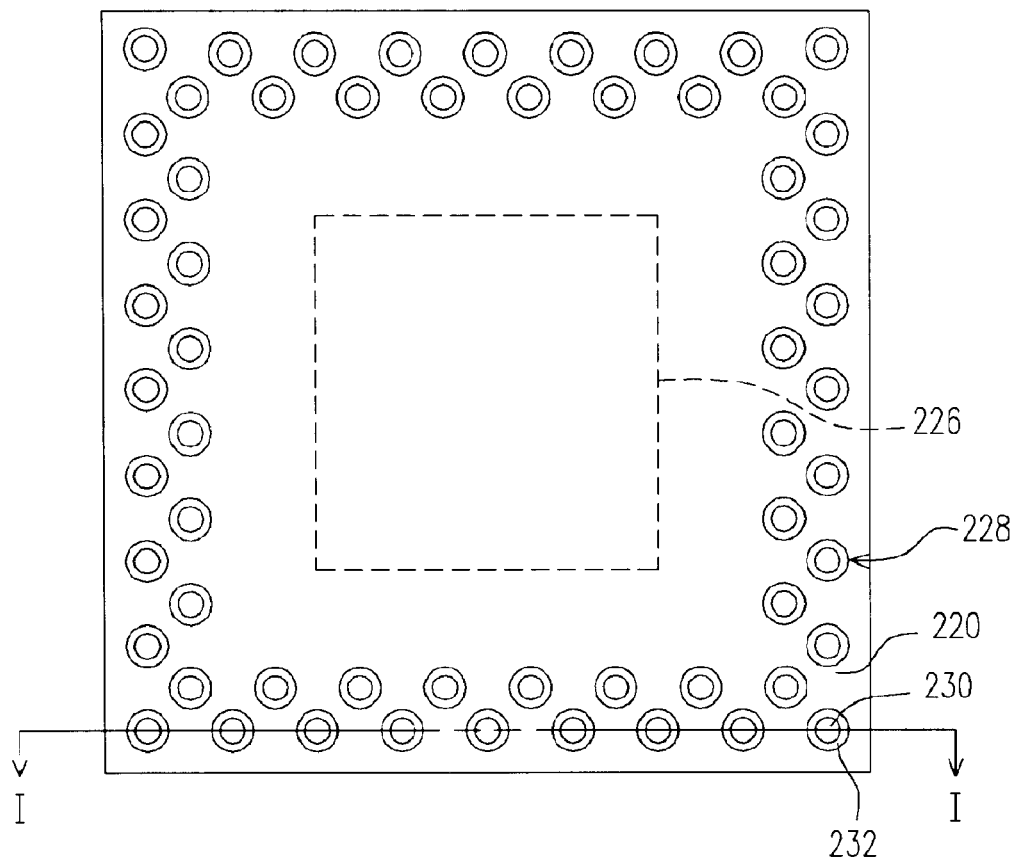
FIG. 2A is a top view showing a quad flat no-lead type of chip carrier according to one preferred embodiment of this invention.
Figure 2B:
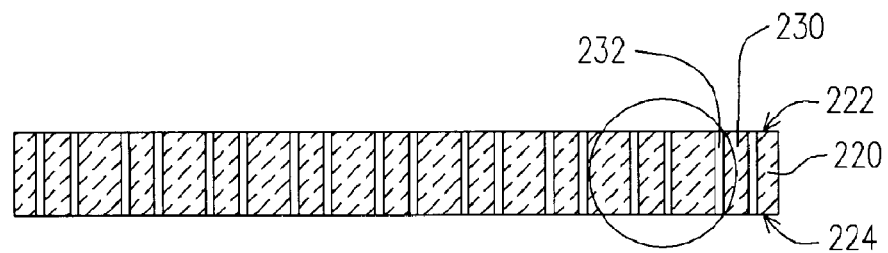
FIG. 2B is a cross-sectional view along line 1—1 in FIG. 2A.

FIG. 2A is a top view showing a quad flat no-lead type of chip carrier according to one preferred embodiment of this invention. FIG. 2B is a cross-sectional view along line 1—1 in FIG. 2A. As shown in FIG. 2A, the chip carrier 210 comprises a conductive plate 220, a plurality of conductive columns 230 and a plurality of dielectric walls 232. The conductive plate 220 has a first surface 222 and a second surface 224. The first surface 222 has a chip-bonding region 226. The conductive plate 220 further has a plurality of surrounding columnar through holes 228 which are distributed on the periphery of the chip-bonding region 226. Each columnar through hole 228 passes through the conductive plate 220 so that the first surface 222 and the second surface 224 of the conductive plate 220 are connected. The conductive plate 220 is fabricated using, for example, copper, aluminum, and an alloy of the two or some other material with a high thermal and electrical conductivity to boost the heat-dissipating capacity. The conductive columns 230 are set up within the respective columnar through holes 228. The dielectric walls 228 are set up between the sidewall of the conductive column 230 and the inner surface of the columnar through holes 228. The conductive columns 230 are fabricated using, for example, copper, aluminum, an alloy of the two or some other material having high electrical conductivity. Since the dielectric walls 232 are fabricated using resinous material with a high dielectric constant, the conductive columns 230 and the conductive plate 220 are effectively isolated from each other.

As shown in FIG. 2A, the conductive columns 230 are positioned on the periphery of the chip-bonding region. Moreover, neighboring conductive columns 230 are alternately laid in a staggered arrangement. This type of arrangement not only facilitates wire bonding, but also increases the space available for accommodating the conductive columns 230 so that a higher density of the conductive columns 230 can be obtained.

Figure 3:
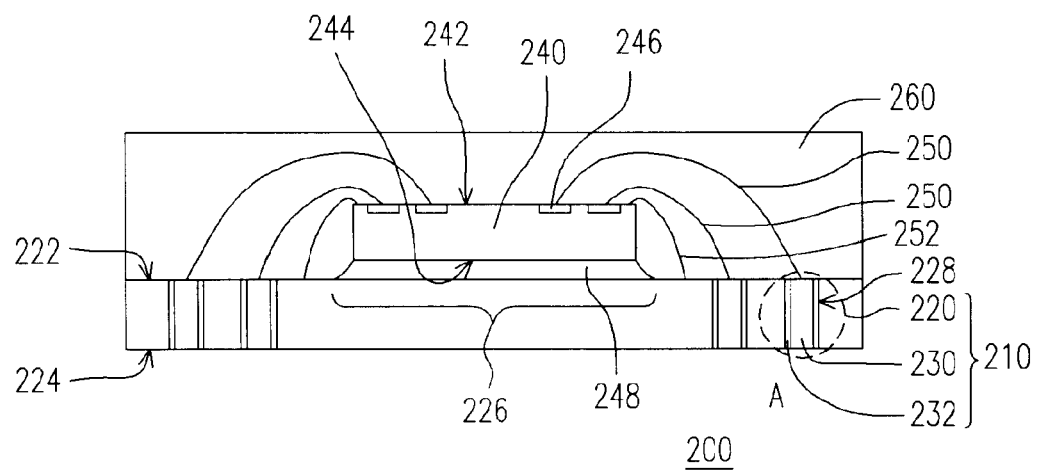
FIG. 3 is a schematic cross-sectional view showing a quad flat no-lead chip package according to one preferred embodiment of this invention.

FIG. 3 is a schematic cross-sectional view showing a quad flat no-lead type of chip package according to one preferred embodiment of this invention. As shown in FIG. 3, the chip package 200 comprises a chip carrier 210, a chip 240, a plurality of first conductive wires 250 and some insulating material 260. The chip carrier 210 furthermore comprises a conductive plate 220, a plurality of conductive columns 230 and a plurality of dielectric walls 232. The conductive plate 230 has a plurality of columnar through holes 228 on the periphery of a chip-bonding region 226. Each columnar through hole 228 passes through the conductive plate 220 to connect a first surface 222 and a second surface 224 of the conductive plate 220. Furthermore, the conductive columns 230 are set up within the respective columnar through holes 228. The dielectric wall 232 is set up between the sidewall of the conductive column 230 and the inner surface of the corresponding columnar through hole 228.

The chip 240 has an active surface 242 and a backside 244. The active surface 242 of the chip 240 has a plurality of bonding pads 246 thereon. The backside 244 of the chip 240 is attached to the chip-bonding region 226 via a layer of conductive paste 248 such as silver epoxy. In addition, the bonding pads 246 of the chip 240 are electrically connected to corresponding conductive columns 230 via the first conductive wires 250. The insulating material 260 encloses the chip 240, the first conductive wires 250 and the first surface 222 of the conductive plate 220 for protecting the chip 240 and the first conductive wires 250. The first conductive wires 250 are signal wires, for example. A second conductive wire 252 for connecting the chip 240 and the conductive plate 220 together is also included. The conductive wire 252 is a ground wire or a power wire, for example. The first conductive wires 250 for connecting the chip 240 to the conductive columns 230 are formed in a wire-bonding operation. Furthermore, the chip 240 is electrically connected to the conductive plate 220 via the second conductive wire 252. The purpose of having an electrical connection between the chip 240 and the conductive plate 220 is that the chip 240 can have a relatively larger ground plane (or power plane).

The cross-sectional view of the conductive plate 220 and the conductive columns 230 in FIG. 3 also shows that each conductive column 230 is individually isolated from each other within the conductive plate 220. Hence, when two high frequency signals are transmitted via a pair of neighboring conductive columns 230, the signals are shielded by the conductive plate 220 serving as a reference plane. In other words, cross talk between the two high frequency signals is minimal and thereby effectively increasing the electrical performance of the chip package 200. Moreover, the conductive plate 220 is also design to prevent any insulating material from bleeding into the bottom surface 224 of the conductive plate 220 during packaging 260 so that overall quality of the chip package 200 is improved.

Figure 4:
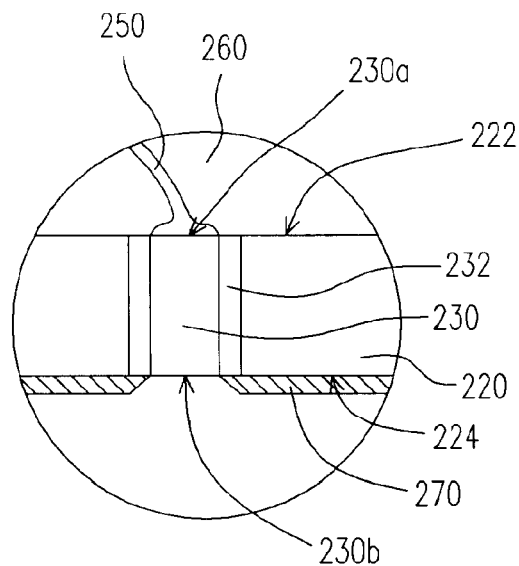
FIG. 4 is a enlarged view of the area labeled A in FIG. 3.

FIG. 4 is an enlarged view of the area labeled A in FIG. 3. To increase the bondability between the insulating material 260 and the first surface 222 of the conductive plate 220, a step of surface finishment (ex. etching) is performed to form a rough surface at the first surface 222 for a larger bonding area. Similarly, to increase the bonding area between the insulating material 260 and the first surface 222, an oxide layer may be formed over the first surface 222. Furthermore, a patterned solder mask layer 270 or other solder mask material may cover the second surface 224 of the conductive plate 220 but expose the bottom end 230b of the conductive column 230 near the second surface 224. In addition, the first conductive wire 250 may connect with the upper end 230a of the conductive column 230 so that the bottom end 230b of the conductive column 230 can serve as a contact. For example, the contact is electrically connected to an external printed circuit board (not shown) via some solder paste (not shown).

Accordingly, the quad flat no-lead chip carrier of this invention is suitable for a wire-bonding type of chip package. The chip carrier mainly comprises a conductive plate, a plurality of conductive columns and a plurality of dielectric walls. The chip is set up on the conductive plate. The conductive plate furthermore has a plurality of columnar through holes distributed on the periphery of a chip-bonding region. The conductive columns are set up within various columnar through holes. The dielectric walls are set up between the sidewall of the conductive columns and the inner surface of the columnar through holes. The chip is electrically connected to the top ends of the conductive columns through conductive wires in a wire bonding operation. Therefore, the bottom ends of the conductive columns can serve as input/output (I/O) contacts for connecting with external devices.

In summary, major advantages of the quad flat no-lead chip carrier includes: 1. The conductive columns are distributed on the periphery of the chip-bonding region so that their spatial occupation is reduced. In other words, density of the I/O contacts within the chip package can be increased. 2. Insulating material is prevented from bleeding into the bottom surface of the conductive plate. Consequently, quality of the chip package is improved. 3. Cross talk between two high frequency signals passing through a pair of neighboring conductive columns is greatly reduced due to the shielding effect of the conductive plate serving as a reference plane. Hence, the electrical performance of the chip package is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A quad flat no-lead chip carrier, comprising:

a conductive plate having a first surface and a second surface, wherein the first surface has a chip-bonding region and the conductive plate furthermore has a plurality of columnar through holes located on the periphery of the chip-bonding region such that the columnar through holes pass through the conductive plate to link up the first and the second surfaces;

a plurality of solid conductive columns set up within the respective columnar through holes; and a plurality of dielectric walls set up between the sidewall of the solid conductive columns and the inner surface of corresponding columnar through holes.

2. The chip carrier of claim 1, wherein the first surface of the conductive plate is a rough surface.

3. The chip carrier of claim 1, wherein the first surface of the conductive plate has an oxide layer thereon.

4. The chip carrier of claim 1, wherein the carrier further comprises a solder mask layer set up on the second surface of the conductive plate that exposes a portion of an end surface of the conductive columns near the second surface.

5. A quad flat no-lead chip package, comprising:
a chip carrier comprising:
a conductive plate having a first surface and a second surface, wherein the first surface has a chip-bonding region and the conductive plate furthermore has a plurality of columnar through holes located on the periphery of the chip-bonding region such that the columnar through holes pass through the conductive plate to link up the first and the second surface;

a plurality of solid conductive columns set up within the respective columnar through holes; and a plurality of dielectric walls set up between the sidewall of the solid conductive columns and the inner surface of the corresponding columnar through holes;

a chip attached to the chip-bonding region on the first surface of the conductive plate;

a plurality of first conductive wires electrically connecting the chip and the solid conductive columns; and an insulating material enclosing the chip and the first conductive wires.

6. The chip package of claim 5, wherein the package further comprises at least a second conductive wire electrically connecting the chip to the conductive plate.

7. The chip package of claim 5, wherein the package further comprises a conductive paste layer sandwiched between the chip and the conductive plate.

8. The chip package of claim 5, wherein the first surface of the conductive plate is a rough surface.

9. The chip package of claim 5, wherein the first surface of the conductive plate has an oxide layer thereon.

10. The chip package of claim 5, wherein the carrier further comprises a solder mask layer set up on the second surface of the conductive plate that exposes a portion of an end surface of the conductive columns near the second surface.

11. A quad flat no-lead chip carrier, comprising:
a conductive plate having a first surface and a second surface, wherein the first surface has a chip-bonding region and the conductive plate further has a plurality of columnar through holes located on the periphery of the chip-bonding region such that the columnar through holes pass through the conductive plate to link up the first and the second surfaces;

a plurality of solid conductive columns disposed within the respective columnar through holes;

a plurality of dielectric walls disposed between the sidewall of the conductive columns and the inner surface of the corresponding columnar through holes, wherein the dielectric walls are disposed within the corresponding columnar through holes; and a chip attached to the first surface of the conductive plate through a plurality of conductive wires connecting the chip and the conductive columns.

12. The quad flat no-lead chip carrier of claim 11, wherein the solid conductive columns completely fill the corresponding columnar through holes.

13. The quad flat no-lead chip carrier of claim 11, wherein the carrier further comprises a solder mask layer configured on the second surface of the conductive plate that exposes a portion of an end surface of the conductive columns near the second surface.

14. The quad flat no-lead chip carrier of claim 11, wherein the first surface of the conductive plate is a rough surface.

15. The quad flat no-lead chip carrier of claim 11, wherein the first surface of the conductive plate has an oxide layer thereon.

* * * * *